(12) United States Patent
Huang et al.

(10) Patent No.: US 8,697,986 B2
(45) Date of Patent: Apr. 15, 2014

(54) PHOTOVOLTAIC DEVICE WITH DOUBLE-JUNCTION

(75) Inventors: Ming-Jeng Huang, Hsinchu (TW); Han-Tu Lin, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 446 days.

(21) Appl. No.: 13/037,508

(22) Filed: Mar. 1, 2011

(65) Prior Publication Data

US 2012/0222729 A1    Sep. 6, 2012

(51) Int. Cl.
*H01L 31/00* (2006.01)
*H01L 27/142* (2014.01)
*H01L 31/0352* (2006.01)

(52) U.S. Cl.
CPC ...... *H01L 27/1422* (2013.01); *H01L 31/03529* (2013.01); *Y02E 10/545* (2013.01); *Y02E 10/546* (2013.01); *Y02E 10/547* (2013.01); *Y02E 10/548* (2013.01)
USPC ........................................................ 136/255

(58) Field of Classification Search
CPC .................. H01L 27/1422; H01L 31/022441; H01L 31/03529; H01L 31/0504; H01L 31/0508; H01L 31/0682; H01L 31/0684; Y02E 10/52; Y02E 10/545
USPC ........................................................ 136/255
See application file for complete search history.

(56) References Cited

U.S. PATENT DOCUMENTS

| | | | |
|---|---|---|---|
| 4,318,115 A | 3/1982 | Yoshikawa et al. | |
| 4,865,999 A * | 9/1989 | Xi et al. | 438/83 |
| 5,162,887 A | 11/1992 | Dierschke | |
| 5,360,987 A | 11/1994 | Shibib | |
| 6,333,457 B1 | 12/2001 | Mulligan et al. | |
| 6,369,415 B1 * | 4/2002 | Janesick | 257/228 |
| 6,504,178 B2 | 1/2003 | Carlson et al. | |
| 6,590,242 B1 | 7/2003 | Kozuka et al. | |
| 6,649,951 B2 | 11/2003 | Kozuka et al. | |
| 6,653,164 B2 | 11/2003 | Miida | |
| 7,235,831 B2 | 6/2007 | Kozuka et al. | |
| 7,468,485 B1 | 12/2008 | Swanson | |
| 2010/0078059 A1 | 4/2010 | Lee | |

FOREIGN PATENT DOCUMENTS

| | | |
|---|---|---|
| CN | 1268773 A | 10/2000 |
| EP | 1032049 A2 | 8/2000 |

* cited by examiner

*Primary Examiner* — Tamir Ayad
(74) *Attorney, Agent, or Firm* — Morris Manning & Martin LLP; Tim Tingkang Xia, Esq.

(57) ABSTRACT

The present invention, a photovoltaic device includes a substrate having a first doped-type, a first doped region having a second doped-type in the substrate, a second doped region in a portion of the first doped region and exposing the other portion of the first doped region, and a third doped region in the exposed portion of the first doped region. The polarity of the second doped-type is substantially reversed with that of the first doped-type. The second doped region has a polarity substantially identical to that of the first doped-type and a doped concentration substantially greater than that of the substrate. The third doped region has a polarity substantially identical to that of the second doped-type and a doped concentration substantially greater than that of the first doped region. The first doped-type is one of N-type and P-type, while the second doped-type is the other of P-type and N-type.

10 Claims, 5 Drawing Sheets

US 8,697,986 B2

PHOTOVOLTAIC DEVICE WITH DOUBLE-JUNCTION

FIELD OF THE INVENTION

The present invention relates generally to a photovoltaic device, and more particularly, to a photovoltaic device with at least double junctions.

BACKGROUND OF THE INVENTION

A photovoltaic cell is a solid state device that converts the energy of sunlight into electricity by the photovoltaic effect. Assemblies of photovoltaic cells are used to make photovoltaic modules or solar panels. Due to the growing demand for renewable energy sources, the manufacture of photovoltaic cells has advanced dramatically in recent years. The most common type of photovoltaic cells is configured as a large-area p-n junction made from bulk materials such as crystalline silicon or polycrystalline silicon.

FIG. 5 shows schematically a cross sectional view of a conventional photovoltaic cell 500. A single p-n junction is formed between a layer of N-type semiconductor 520 and a P-type semiconductor substrate 510. Typically, the layer of N-type semiconductor 520 is formed by ion implantation or surface diffusion of an N-type dopant into the front side of the substrate 510. A depletion or space charge region 550 is formed at the interface where the P-type substrate 510 and the N-type layer 520 meet. In the absence of an external applied voltage, an equilibrium condition is reached when the built-in electric field in the depletion region balances out the diffusion of electrons and holes. A metal electrode 590 is formed on the back side of the substrate 510 and a metal "finger" electrode 570 is formed on the N-type layer 520. The electrodes 590 and 570 are connected to an external load through a wire. As sunlight shines on the single p-n junction from the front side of the substrate 510, electrons in the semiconductor may absorb the light and be excited into the conduction band allowing them to move freely within the semiconductor. The free electrons created in the N-type layer 520 or have been collected by the single p-n junction and swept into the N-type layer 520 may travel through the wire, power the load, and continue through the wire until they reach the P-type substrate where they recombine with holes there. So as to the holes travel through the opposite way to generate the photo-current. Such single junction photovoltaic cells tend to have a relatively low conversion efficiencies, however, usually no more than 18%. This is because the electrons generate at the P-type neutral region or holes generate at the N-type neutral region were quickly recombined, since they were minority carries. However, only the photons absorbed in depletion region or absorbed in neutral region that within electron's or hole's diffusion length, can contributed as photo-current.

Therefore, a heretofore unaddressed need exists in the art to address the aforementioned deficiencies and inadequacies.

SUMMARY OF THE INVENTION

In one aspect, the present invention relates to a photovoltaic device with at least double junctions. In one embodiment, the photovoltaic device includes a substrate having a first surface and an opposite, second surface, where the substrate has a first doped-type.

The photovoltaic device also includes a first doped region in the first surface of the substrate, where the first doped region has a second doped-type, and a polarity of the second doped-type is substantially reversed with a polarity of the first doped-type.

Further, the photovoltaic device includes a second doped region in a portion of the first doped region and exposing the other portion of the first doped region, where a polarity of the second doped region is substantially identical to the polarity of the first doped-type. In one embodiment, a doped concentration of the second doped region is substantially greater than the doped concentration of the substrate.

In one embodiment, the first doped region has a depth ranging from about 1 micron to about 3 microns. The second doped region has a depth ranging from about 0.05 microns to about 0.5 microns. In one embodiment, a boundary of the second doped region is contacted with a material of the first doped region and a material of the substrate.

Moreover, the photovoltaic device includes a third doped region in the exposed portion of the first doped region, where a polarity of the third doped region is substantially identical to the polarity of the second doped-type and a doped concentration of the third doped region is substantially greater than a doped concentration of the first doped region.

Additionally, the photovoltaic device also has a first electrode on the third doped region.

In one embodiment, the photovoltaic device further includes a fourth doped region in the second surface of the substrate, and a second electrode forming on the fourth doped region. A polarity of the fourth doped region is substantially identical to the polarity of the first doped-type, and a doped concentration of the fourth doped region is substantially greater than the doped concentration of the second doped region. The photovoltaic device also includes a first dielectric layer covering on the first surface of the substrate, where the first dielectric layer has a first opening exposed the first electrode.

In another embodiment, the photovoltaic device further includes a fourth doped region in a portion of the second doped region and exposing the other portion of the second doped region, and a second electrode forming on the fourth doped region, where a polarity of the fourth doped region is substantially identical to the polarity of the first doped-type, and a doped concentration of the fourth doped region is substantially greater than the doped concentration of the second doped region.

The photovoltaic may also have a first dielectric layer covering on the first surface of the substrate, where the first dielectric layer has a first opening and a second opening exposed the first electrode and the second electrode, respectively, and a second dielectric layer covering on the second surface of the substrate.

In one embodiment, the first doped-type is one of N-type and P-type, and the second doped-type is the other of P-type and N-type.

These and other aspects of the present invention will become apparent from the following description of the preferred embodiment taken in conjunction with the following drawings, although variations and modifications therein may be affected without departing from the spirit and scope of the novel concepts of the disclosure.

BRIEF DESCRIPTION OF THE DRAWINGS

The accompanying drawings illustrate one or more embodiments of the invention and, together with the written description, serve to explain the principles of the invention. Wherever possible, the same reference numbers are used throughout the drawings to refer to the same or like elements of an embodiment, and wherein.

DETAILED DESCRIPTION OF THE INVENTION

Figure 1:
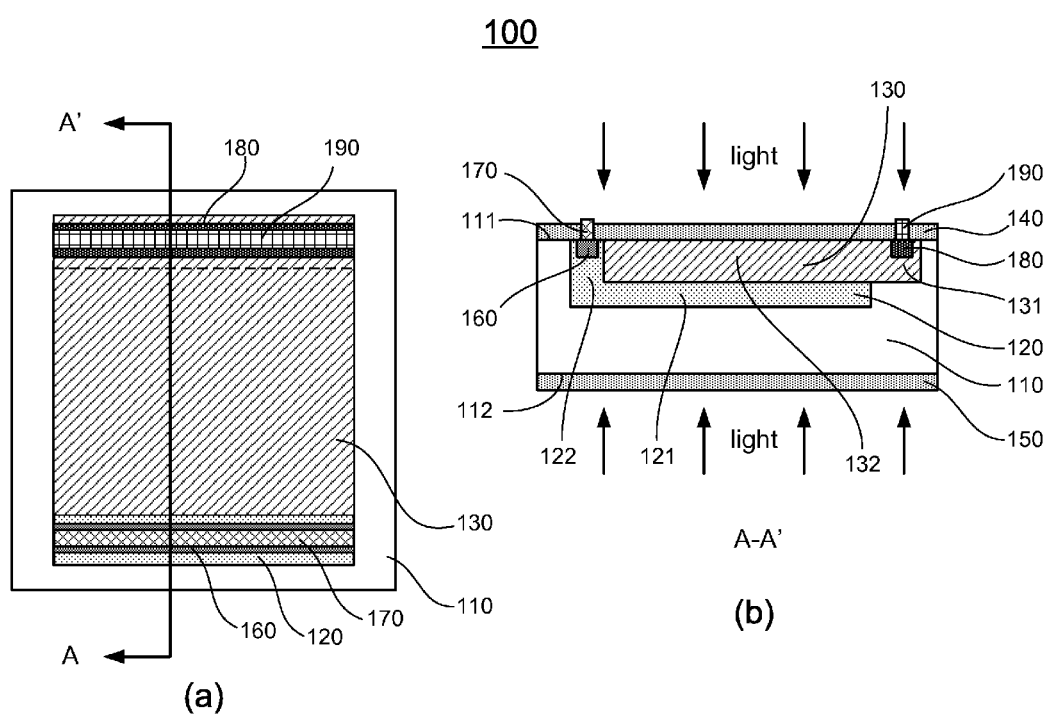
FIG. 1 shows schematically (a) a top view and (b) a cross sectional view of a photovoltaic device according to one embodiment of the present invention.

The present invention will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed as a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising," "including," "carrying," "having," "containing," "involving," and the like are to be understood to be open-ended, i.e., to mean including but not limited to.

The term "electrode", as used herein, is an electrically conductive layer or film comprising a single-layer structure or a multi-layer structure formed of one or more electrically conductive materials.

The description will be made as to the embodiments of the present invention in conjunction with the accompanying drawings in FIGS. 1-4. In accordance with the purposes of this invention, as embodied and broadly described herein, this invention, in one aspect, relates to a photovoltaic device with double junctions.

FIG. 1 shows schematically (a) a top view and (b) a cross sectional view of a photovoltaic device 100 according to one embodiment of the present invention. The photovoltaic device 100 includes a substrate 110 having a first surface 111 and an opposite, second surface 112, a first doped region (or namely first doped well) 120 formed in the first surface 111 of the substrate 110, a second doped region (or namely second doped well) 130 in a portion 121 of the first doped region 120 such that the other portion 122 of the first doped region 120 is exposed, a third doped region 160 formed in the exposed portion 122 of the first doped region 120, and a fourth doped region 180 in a portion 131 of the second doped region 130 and exposing the other portion 132 of the second doped region 130.

The substrate 110 has a first doped-type having a polarity. The first doped region 120 has a second doped-type having polarity. The polarity of the second doped-type is substantially reversed with the polarity of the first doped-type. The polarity of the second doped region 130 is substantially identical to the polarity of the first doped-type of the substrate 110. The polarity of the third doped region 160 is substantially identical to the polarity of the second doped-type of the first doped region 120 and a doped concentration of the third doped region 160 is substantially greater than a doped concentration of the first doped region 120. The polarity of the fourth doped region 180 is substantially identical to the polarity of the first doped-type of the second doped region 130 and a doped concentration of the fourth doped region 180 is substantially greater than the doped concentration of the second doped region 130. Preferably, the doped concentration of the second doped region 130 is substantially greater than both of a doped concentration of the substrate 110 and the doped concentration of the first doped region 120. Most preferably, the doped concentration of the third doped region 160 is substantially lower than the doped concentration of the fourth doped region 180. In some embodiment, the doped concentration of the third doped region 160 may be substantially equal to the doped concentration of the second doped region 130.

The first doped-type is one of N-type and P-type, while the second doped-type is the other of P-type and N-type. In other words, as the first doped-type is N-type and then the second doped-type is P-type, or as the first doped-type is P-type and then the second doped-type is N-type.

Further, the photovoltaic device 100 also has a first electrode 170 formed on the third doped region 160, and a second electrode 190 formed on the fourth doped region 180.

Figure 2:
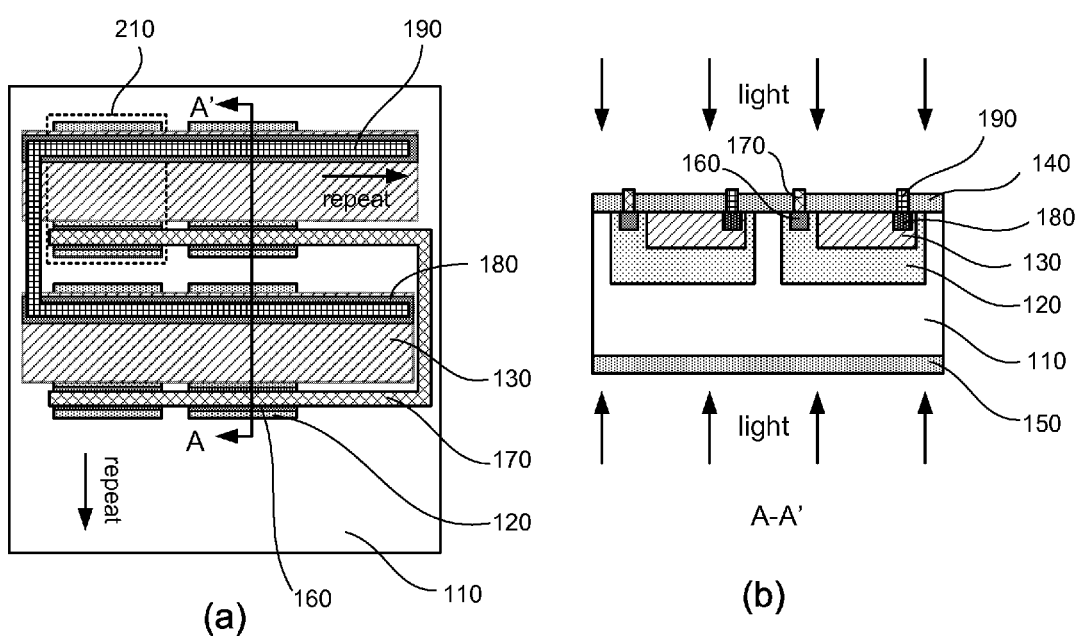
FIG. 2 shows schematically (a) a top view and (b) a cross sectional view of a photovoltaic module according to one embodiment of the present invention.

As the examples of illustrating the present invention with the accompanying drawings of FIGS. 1 and 2, the first doped-type is a P-type, while the second doped-type is an N-type. More specifically, the photovoltaic device 100 includes a P-type substrate 110, an N-type well 120 formed on the front surface of the P-type substrate 110, and a P+ region 130 formed on the N-type well 120 such that a portion 122 of the N-type well 120 is exposed. The photovoltaic device 100 further includes a first electrode 170 formed on the portion 122 of the N-type well 120 that is exposed, and a second electrode 190 formed on the P+ region 130. The P+ region 130 is a high concentration doping region with a doped concentration that is greater than the doped concentration in the P-type substrate 110.

With this construction, the photovoltaic device 100 has two p-n junctions, one at the interface between the P-type substrate 110 and the N-type well 120, and the other at the interface between the N-type well 120 and the P+ region 130. Compared to a single-junction photovoltaic device, the photovoltaic device 100 has a larger depletion region per unit surface area. As a result, incident light is more likely to be absorbed by electrons in the depletion region. The free electrons created in the depletion region are separated from holes by the built-in electric field in that region and are thus less likely to be combined with holes. Thus the photovoltaic device 100 may afford higher conversion efficiencies than conventional single junction photovoltaic devices.

In various embodiments, the P-type substrate 110 may comprise a lightly doped semiconductor material such as silicon, germanium, or compound semiconductors. The materials may be in monocrystalline, polycrystalline, or amorphous form. In a typical manufacturing process, monocrystalline or polycrystalline silicon wafers are made by wire-sawing block-cast silicon ingots into thin slices of wafers of a thickness ranging from about 180 microns to about 350 microns. The wafers are usually lightly P-type doped. To make the photovoltaic cell 100, a surface diffusion or ion implantation of N-type dopants is performed on the front side of the wafer 110 to form the N-type well 120 of a thickness ranging from about 1 micron to about 3 microns. A mask may be used during the surface diffusion or ion implantation process so that the N-type well 120 of a certain geometry and size may be formed. Typical N-type dopants include group V ions such as arsenic (As) or phosphorus (P) ions. Subsequently, a surface diffusion or ion implantation of P-type dopants is performed on the N-type well 120 to form a P+ region 130 of a thickness ranging from about 0.05 microns to about 0.5 microns. A mask is used during the second surface diffusion or ion implantation process so that a portion of the N-type well 120 is exposed where the first electrode 170 may be formed thereon. Typical P-type dopants include group III ions, such as boron (B) ions. Usually, the P+ region 130 has a higher carrier concentration than the carrier concentration of the P-type substrate 110.

For the photovoltaic device 100, light may be incident from either the front side or the back side of the P-type substrate 110. To prevent carrier recombination at the surface of the photovoltaic device 100, a first dielectric passivation layer 150 is formed on the back side of the P-type substrate 110. A second dielectric passivation layer 140 is formed on the P+ region 130, the exposed portion of the N-type well 120 and a portion of the front surface of the P-type substrate 110 uncovered by the N-type well 120 and the P+ region 130 such that the first electrode 170 and the second electrode 190 are exposed. Typical materials for the passivation layers 140 and 150 is single layer or multi-layer structures, one of the materials of the passivation layer 140 and 150 is include inorganic material (such as $SiO_2$, SiN, SiON, other suitable materials, or the combination thereof), organic material (such as polyimide, poly ester, poly(Methyl Methacrylate), diamond-like carbon (DLC), fluorinated DLC, fluorinated polyimides, parylene-N, parylene-F, benzocyclobutanes, poly(arylene ethers), polytetrafluoroethylene derivatives, poly(naphthalenes), poly(norbornenes), foams of polyimides, organic xerogels and porous PTFE, other suitable materials, or the combination thereof), or the combination thereof. In one embodiment, the first passivation layer 150 and the second passivation layer 140 are formed at the same time by oxidation or nitration of the silicon substrate in a furnace. In alternative embodiments, the passivation layers 140 and 150 may comprise $HfO_2$ or $Al_2O_3$, or other dielectric materials, and may be formed by thin film deposition techniques such as chemical vapor deposition (CVD), atomic layer deposition (ALD).

To form the first electrode 170 and the second electrode 190, openings are made in the second passivation layer 140. In order to form a good ohmic contact between the first electrode 170 and the N-type well 120, a heavily doped N+ region 160 is created in the exposed portion of the N-type well 120 by sequentially performing the steps of photolithography, etching, N-type ion implantation, photoresist removal, and rapid thermal processing for dopant activation. The first electrode 170 is then formed on the heavily doped N+ region 160. Likewise, a heavily doped P++ region 180 is created in the P+ region 130 using similar processes to facilitate the formation of a good ohmic contact between the second electrode 190 and the P+ region 130. One of the first electrode 170 and the second electrode 190 is single layer or multi-layer structures, a materials of one of the first electrode 170 and the second electrode 190 is include transparent materials (such as indium tin oxide, aluminum zinc oxide, indium zinc oxide, hafnium oxide, cadmium tin oxide, germanium zinc oxide, other suitable materials, or any combination thereof), non-transparent materials (such as Au, Ag, Al, Cu, Ti, Fe, Mo, Ni, Ta, Sn, Pb, V, alloy thereof, nitride thereof, oxide thereof, oxy-nitride thereof, other suitable materials, or any combination thereof), or any combination thereof.

FIG. 2 shows schematically (a) a top view and (b) a cross sectional view of a photovoltaic module 200 according to one embodiment of the present invention. The photovoltaic module 200 includes a plurality of photovoltaic cells 210 spatially arranged as an array with rows and columns. Each photovoltaic cell 210 has a structure that is similar to the photovoltaic device 100 shown in FIG. 1. In one embodiment, a plurality of N-type wells 120 is formed in the P-type substrate 110 by using a mask. In one embodiment, each N-type well 120 may have a width of about 1 mm. Then, using another mask, a plurality of elongated P+ regions 130 is formed, each P+ region 130 overlapping a respective row of N-type wells 120. In one embodiment, the plurality of photovoltaic cells 210 is connected to each other in parallel by having a common first electrode 170 and a common second electrode 190 as shown in FIG. 2. In other embodiments, the plurality of photovoltaic cells 210 may be connected to each other in series, or in a combination of serial and parallel connections. A first passivation layer 150 is formed on the back side of the P-type substrate 110. A second passivation layer 140 is formed on the front side of the P-type substrate 110 over the plurality of N-type wells 120 and the plurality of P+ regions 130 and exposing the first electrode 170 and the second electrode 190. Light may incident from either the front side or the back side of the P-type substrate 110.

It should be noted that, in an alternative embodiment, the first doped-type is an N-type, while the second doped-type is a P-type.

Figure 3:
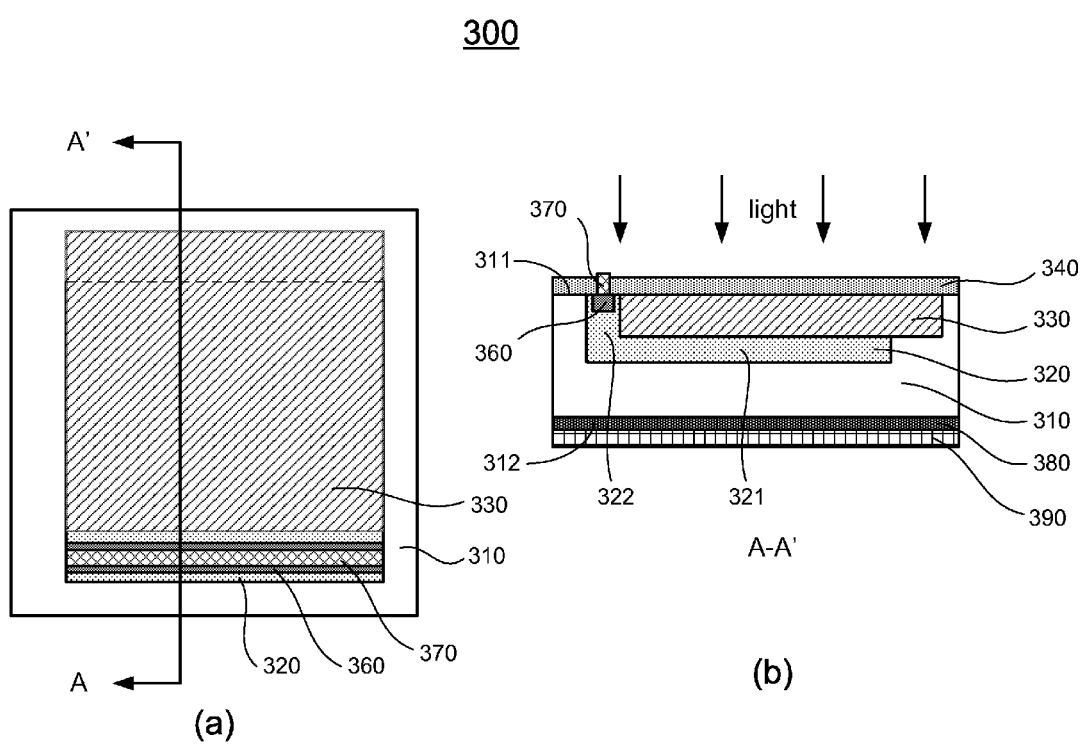
FIG. 3 shows schematically (a) a top view and (b) a cross sectional view of a photovoltaic device according to another embodiment of the present invention.

Refer to FIG. 3, a photovoltaic device 300 is shown according to another embodiment of the present invention. Similar to the photovoltaic device 100 as shown in FIG. 1, the photovoltaic device 300 includes a substrate 310 having a first surface 311 and an opposite, second surface 312, a first doped region 320 formed in the first surface 311 of the substrate 310, a second doped region 330 formed in a portion 321 of the first doped region (or namely first doped well) 320 and exposing the other portion 322 of the first doped region 320, and a third doped region 360 formed in the exposed portion 322 of the first doped region 320. However, the photovoltaic device 300 has a fourth doped region 380 formed on in the second surface 312 of the substrate 310.

The photovoltaic device 300 also has a first electrode 370 formed on the third doped region 360, and a second electrode 390 formed on the fourth doped region 380.

Similarly, the substrate 310 has a first doped-type having a polarity. The first doped region 320 has a second doped-type having polarity. The polarity of the second doped-type is substantially reversed with the polarity of the first doped-type. The polarity of the second doped region 330 is substantially identical to the polarity of the first doped-type of the substrate 310. The polarity of the third doped region 360 is substantially identical to the polarity of the second doped-type of the first doped region 320 and a doped concentration of the third doped region 360 is substantially greater than a doped concentration of the first doped region 320. The polarity of the fourth doped region 380 is substantially identical to the polarity of the first doped-type of the second doped region 330 and a doped concentration of the fourth doped region 380 is substantially greater than the doped concentration of the substrate 310. Preferably, the doped concentration of the second doped region 330 is substantially greater than both of a doped concentration of the substrate 310 and the doped concentration of the first doped region 320. In one embodiment, the doped concentration of the second doped region 330 is substantially equal to the doped concentration of the fourth doped region 380. In other embodiment, the doped concentration of the third doped region 360 may be substantially equal to the doped concentration of the second doped region 330.

The first doped-type is one of N-type and P-type, while the second doped-type is the other of P-type and N-type. In other words, as the first doped-type is N-type and then the second doped-type is P-type, or as the first doped-type is P-type and then the second doped-type is N-type.

The present invention will now be described more fully hereinafter with reference to the accompanying drawings, in which exemplary embodiments of the invention are shown.

In the following exemplary embodiments of the present invention shown in FIGS. 3 and 4, the first doped-type is corresponding to a P-type, while the second doped-type is corresponding to an N-type. Specifically, the photovoltaic device 300 includes a P-type substrate 310, an N-type well 320 formed on the front surface of the P-type substrate 310, and a P+ region 330 formed on the N-type well 320 such that a portion of the N-type well 320 is exposed. The photovoltaic device 300 further includes a first electrode 370 formed on the exposed portion of the N-type well 320, a second electrode 390 formed on the back side of the P-type substrate 310. A heavily doped N+ region 360 in the vicinity of the first electrode 370 facilitates the formation of an ohmic contact between the first electrode 370 and the N-type well 320. Similarly, a heavily doped P++ layer 380 between the second electrode 390 and the back surface of the P-type substrate 310 facilitates the formation of an ohmic contact between the second electrode 390 and the P-type substrate 310. In one embodiment, the second electrode 390 covers the entire back side of the P-type substrate 310. In another embodiment, the second electrode 390 is formed on the back side of the P-type substrate 310 in a grid pattern. The photovoltaic device 300 may further include a passivation layer 340 formed on the front side of the P-type substrate 310 over the N-type well 320 and the P+ region 330 and exposing the first electrode 370. The passivation layer 340 is single layer or multi-layer structures, the materials of the passivation layer 340 is include inorganic material (such as $SiO_2$, SiN, SiON, other suitable materials, or the combination thereof), organic material (such as polyimide, poly ester, poly(Methyl Methacrylate), diamond-like carbon (DLC), fluorinated DLC, fluorinated polyimides, parylene-N, parylene-F, benzocyclobutanes, poly (arylene ethers), polytetrafluoroethylene derivatives, poly (naphthalenes), poly(norbornenes), foams of polyimides, organic xerogels and porous PTFE, other suitable materials, or the combination thereof), or the combination thereof. In one embodiment, the passivation layer 340 is formed at the same time by oxidation or nitration of the silicon substrate in a furnace. In alternative embodiments, the passivation layers 340 may comprise $HfO_2$ or $Al_2O_3$, or other dielectric materials, and may be formed by thin film deposition techniques such as chemical vapor deposition (CVD), atomic layer deposition (ALD). One of the first electrode 370 and the second electrode 390 is include transparent materials (such as indium tin oxide, aluminum zinc oxide, indium zinc oxide, hafnium oxide, cadmium tin oxide, germanium zinc oxide, other suitable materials, or any combination thereof), non-transparent materials (such as Au, Ag, Al, Cu, Ti, Fe, Mo, Ni, Ta, Sn, Pb, V, alloy thereof, nitride thereof, oxide thereof, oxy-nitride thereof, other suitable materials, or any combination thereof), or any combination thereof. In typical, the second electrode 390 is non-transparent material, so that the light is incident from the front side of the P-type substrate 310.

In an alternative embodiment, the photovoltaic device 300 may be made from an N-type substrate by forming a P-type well on the front surface of the substrate and an N-type well on the P-type well.

Figure 4:
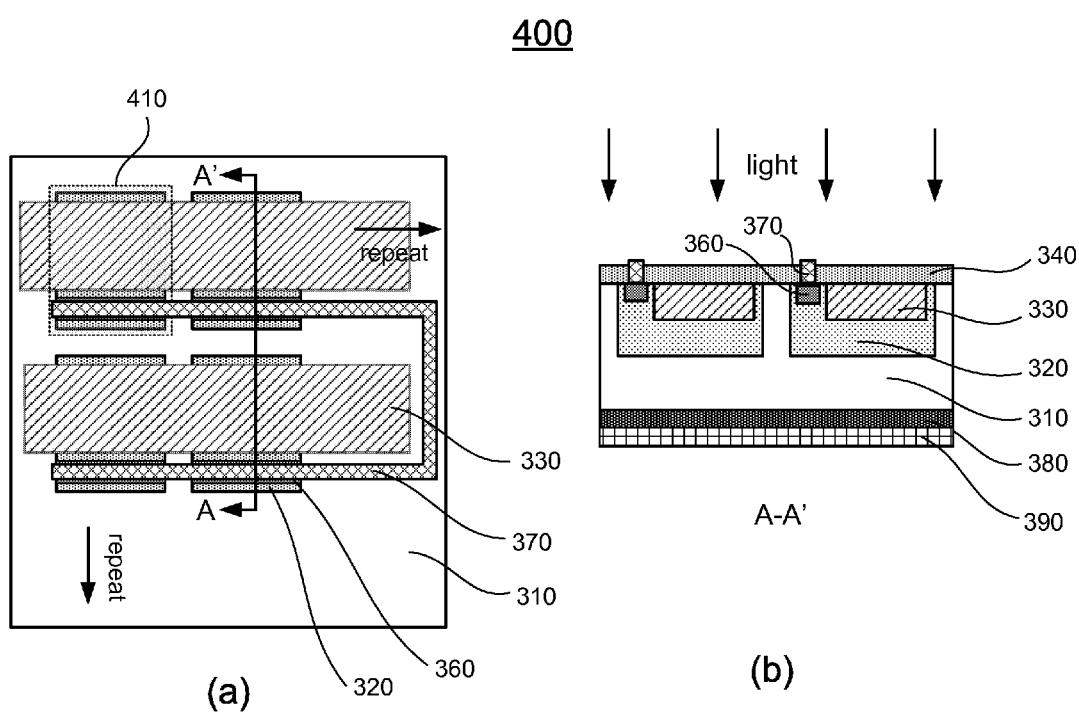
FIG. 4 shows schematically (a) a top view and (b) a cross sectional view of a photovoltaic module according to another embodiment of the present invention.
Figure 5:
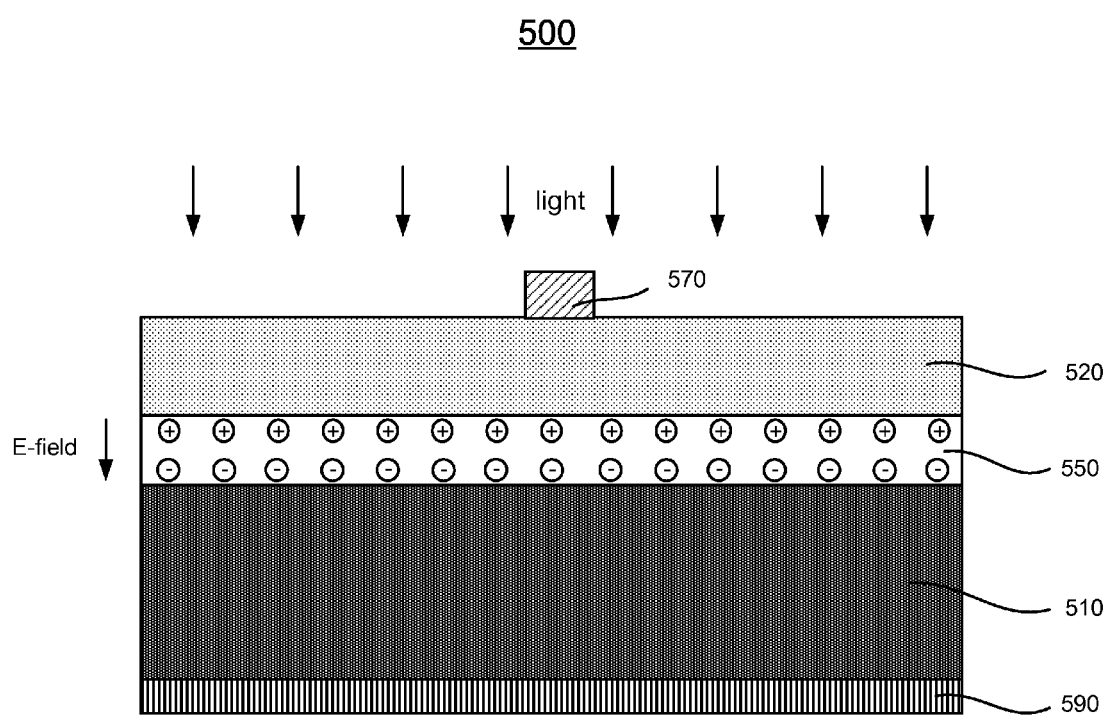
FIG. 5 shows schematically a cross sectional view of a conventional photovoltaic device with a single p-n junction.

FIG. 4 shows schematically (a) a top view and (b) a cross sectional view of a photovoltaic module 400 according to one embodiment of the present invention. The photovoltaic module 400 includes a plurality of photovoltaic cells 410 spatially arranged as an array with rows and columns. Each photovoltaic cell 410 has a structure that is similar to the photovoltaic device 300 shown in FIG. 3. In one embodiment, a plurality of N-type wells 320 is formed in the P-type substrate 310 by using a mask. In one embodiment, each N-type well 320 may have a width of about 1 mm. Then, using another mask, a plurality of elongated P+ regions 330 is formed, each P+ region 330 overlapping a respective row of N-type wells 320. The plurality of photovoltaic cells 410 is connected to each other in parallel by sharing a common first electrode 370 formed on the plurality of N-type wells 320 and a common second electrode 390 formed on the back side of the P-type substrate 310. A passivation layer 340 is formed on the front side of the P-type substrate 310 over the plurality of N-type wells 320 and the plurality of P+ regions 330 and exposing the first electrode 370. Light is incident from the front side of the P-type substrate 310.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A photovoltaic device, comprising:
   (a) a substrate having a first surface and an opposite, second surface, wherein the substrate has a first doped-type;
   (b) a first doped region in the first surface of the substrate, wherein the first doped region has a second doped-type, and a polarity of the second doped-type is substantially reversed with a polarity of the first doped-type, and wherein the first doped region has a first portion and a second portion;
   (c) a second doped region in the first portion of the first doped region, wherein a polarity of the second doped region is substantially identical to the polarity of the first doped-type;
   (d) a third doped region in the second portion of the first doped region, wherein a polarity of the third doped region is substantially identical to the polarity of the second doped-type and a doped concentration of the third doped region is substantially greater than a doped concentration of the first doped region;
   (e) a fourth doped region in a portion of the second doped region, wherein a polarity of the fourth doped region is substantially identical to the polarity of the first doped-type, and a doped concentration of the fourth doped region is substantially greater than the doped concentration of the second doped region, where in a doped concentration of the second doped region is substantially grater than the doped concentration of the substrate; and wherein the doped concentration of the third doped region is substantially lower than the doped concentration of the fourth doped region; and
   (f) a first electrode on the third doped region.

2. The photovoltaic device of claim 1, further comprising: a second electrode formed on the fourth doped region.

3. The photovoltaic device of claim 2, further comprising: a second dielectric layer covering on the second surface of the substrate.

4. The photovoltaic device of claim 2, further comprising: a first dielectric layer covering on the first surface of the substrate, wherein the first dielectric layer has a first opening and a second opening exposing the first electrode and the second electrode, respectively.

5. The photovoltaic device of claim 4, further comprising: a second dielectric layer covering on the second surface of the substrate.

6. The photovoltaic device of claim 1, the first doped-type is one of N-type and P-type, and the second doped-type is the other of P-type and N-type.

7. The photovoltaic device of claim 1, wherein the first doped region has a depth ranging from about 1 micron to about 3 microns.

8. The photovoltaic device of claim 1, wherein the second doped region has a depth ranging from about 0.05 microns to about 0.5 microns.

9. The photovoltaic device of claim 1, wherein a boundary of the second doped region is contacted with a material of the first doped region and a material of the substrate.

10. The photovoltaic device of claim 1, wherein the doped concentration of the third doped region is substantially equal to the doped concentration of the second doped region.

* * * * *